United States Patent
Shimamoto

(10) Patent No.: US 10,911,000 B2
(45) Date of Patent: Feb. 2, 2021

(54) POWER AMPLIFIER MODULE

(71) Applicant: Murata Manufacturing Co., Ltd., Kyoto (JP)

(72) Inventor: Kenichi Shimamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/662,385

(22) Filed: Oct. 24, 2019

(65) Prior Publication Data

US 2020/0136559 A1    Apr. 30, 2020

(30) Foreign Application Priority Data

Oct. 26, 2018 (JP) .................................. 2018-202115
Jun. 28, 2019 (JP) .................................. 2019-120645

(51) Int. Cl.
*H03F 1/02* (2006.01)
*H03F 3/21* (2006.01)

(52) U.S. Cl.
CPC ............ *H03F 1/0211* (2013.01); *H03F 3/211* (2013.01); *H03F 2200/21* (2013.01); *H03F 2200/222* (2013.01); *H03F 2200/451* (2013.01); *H03F 2203/21103* (2013.01)

(58) Field of Classification Search
CPC .................................................. H03F 1/0211
See application file for complete search history.

(56) References Cited

U.S. PATENT DOCUMENTS

| | | | | |
|---|---|---|---|---|
| 6,492,872 | B1* | 12/2002 | Fujioka | H03F 1/301 330/133 |
| 2001/0033199 | A1 | 10/2001 | Aoki | |
| 2002/0119762 | A1* | 8/2002 | Ogihara | H04B 1/109 455/234.1 |
| 2003/0155977 | A1* | 8/2003 | Johnson | G05F 3/265 330/290 |
| 2005/0270094 | A1* | 12/2005 | Nakatani | H03F 1/34 330/107 |
| 2006/0232341 | A1* | 10/2006 | Iwata | H03F 3/189 330/296 |
| 2019/0006994 | A1 | 1/2019 | Sasaki | |
| 2020/0052658 | A1* | 2/2020 | Honda | H03F 3/21 |

FOREIGN PATENT DOCUMENTS

JP  2001-223547 A  8/2001
JP  2017-112588 A  6/2017

\* cited by examiner

*Primary Examiner* — Patricia T Nguyen
(74) *Attorney, Agent, or Firm* — Pearne & Gordon LLP

(57) ABSTRACT

A power amplifier module includes first and second amplifiers, a first bias circuit, and an adjusting circuit. The first amplifier amplifies a first signal. The second amplifier amplifies a second signal based on an output signal from the first amplifier. The first bias circuit supplies a bias current to the first amplifier via a current path on the basis of a bias drive signal. The adjusting circuit includes an adjusting transistor having first, second, and third terminals. A first voltage based on a power supply voltage is supplied to the first terminal. A second voltage based on the bias drive signal is supplied to the second terminal. The third terminal is connected to the current path. The adjusting circuit adjusts the bias current on the basis of the power supply voltage supplied to the first amplifier.

6 Claims, 10 Drawing Sheets

POWER AMPLIFIER MODULE

This application claims priority from Japanese Patent Application No. 2018-202115 filed on Oct. 26, 2018, and claims priority from Japanese Patent Application No. 2019-120645 filed on Jun. 28, 2019. The content of these applications are incorporated herein by reference in their entireties.

BACKGROUND

The present disclosure relates to a power amplifier module. In a mobile communication terminal, such as a cellular phone, a power amplifier module for amplifying a radio frequency (RF) signal to be transmitted to a base station is used. Some power amplifier modules operate in different power modes according to the required power level of an RF signal. Japanese Unexamined Patent Application Publication No. 2017-112588, for example, discloses a power amplifier module which operates in accordance with a low power mode or a high power mode. In the low power mode, the power amplifier module operates at a relatively low voltage level. In the high power mode, the power amplifier module operates at a relatively high voltage level. In this power amplifier module, an amplifier which is ON in either of the low power mode and the high power mode and an amplifier which is OFF in the low power mode and is ON in the high power mode are connected in parallel with each other. As a result of changing the number of operating unit transistors in these amplifiers in accordance with the power mode, power is amplified suitably for the selected power mode.

BRIEF SUMMARY

Reducing the amount of current consumed in a power amplifier module particularly in a low power mode is increasingly demanded. To meet this demand, it is necessary to reduce the amount of current flowing through unit transistors when the power supply voltage is relatively low. Merely adjusting the number of operating unit transistors as disclosed in the above-described publication is not possible to sufficiently reduce the current consumed in the power amplifier module.

The present disclosure provides a power amplifier module in which the consumption of a current can be reduced when the power supply voltage is relatively low.

According to an embodiment of the present disclosure, there is provided a power amplifier module including first and second amplifiers, a first bias circuit, and an adjusting circuit. The first amplifier amplifies a first signal. The second amplifier amplifies a second signal based on an output signal from the first amplifier. The first bias circuit supplies a bias current to the first amplifier via a current path on the basis of a bias drive signal. The adjusting circuit includes an adjusting transistor having first, second, and third terminals. A first voltage based on a power supply voltage is supplied to the first terminal. A second voltage based on the bias drive signal is supplied to the second terminal. The third terminal is connected to the current path. The adjusting circuit adjusts the bias current on the basis of the power supply voltage supplied to the first amplifier.

It is possible to provide a power amplifier module in which the consumption of a current can be reduced when the power supply voltage is relatively low.

Other features, elements, characteristics and advantages of the present disclosure will become more apparent from the following detailed description of embodiments of the present disclosure with reference to the attached drawings.

DETAILED DESCRIPTION

Figure 1:
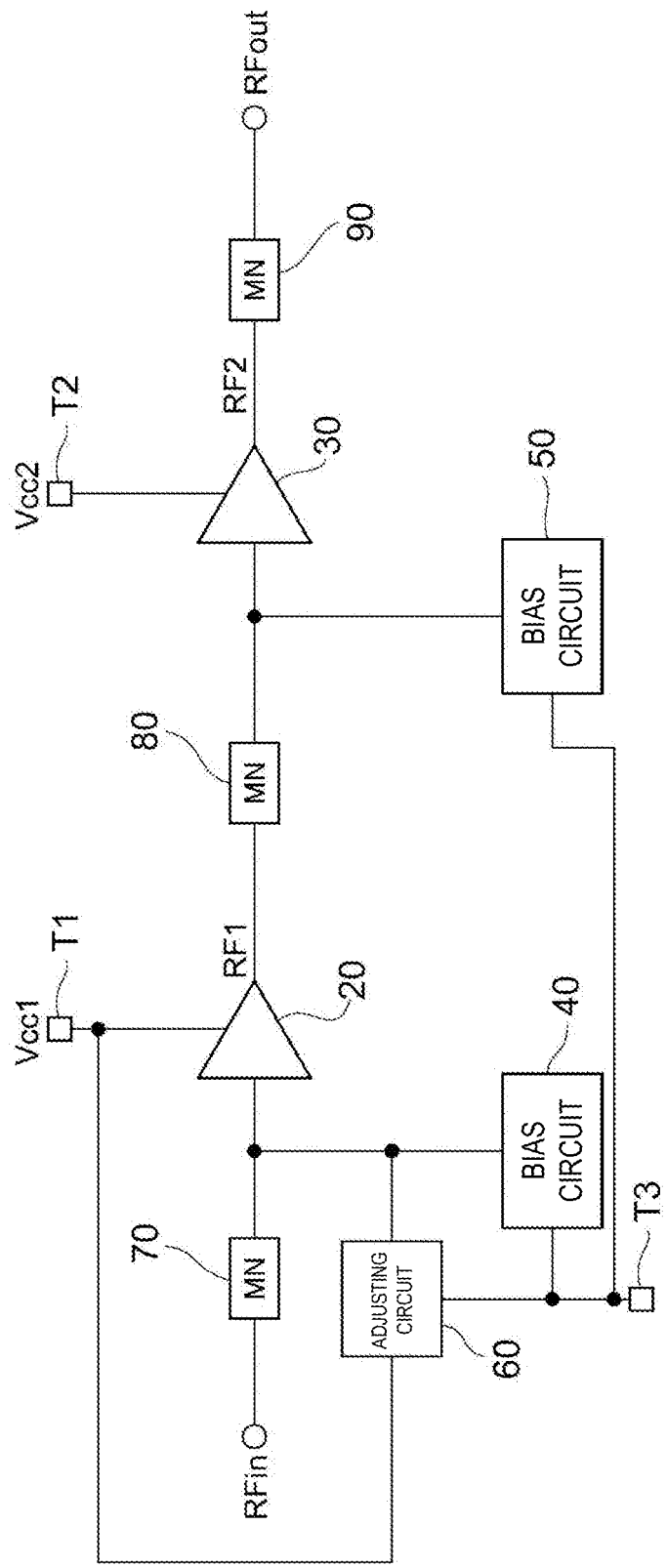
FIG. 1 is a schematic diagram illustrating the configuration of a power amplifier module according to a first embodiment of the disclosure.

Embodiments of the disclosure will be described below with reference to the accompanying drawings. Identical or similar circuit elements are designated by like reference numerals, and an explanation thereof will not be repeated.

FIG. 1 is a schematic diagram illustrating the configuration of a power amplifier module 10 according to a first embodiment of the disclosure. The power amplifier module 10, which is used in a mobile communication device, such as a cellular phone, amplifies power of an input signal RFin to a level high enough to be transmitted to a base station and outputs the input signal RFin as an amplified signal RFout. The input signal RFin is a radio frequency (RF) signal modulated according to a predetermined communication system by using a radio frequency integrated circuit (RFIC), for example. Examples of the communication standard of the input signal RFin are the second generation (2G), the third generation (3G), the fourth generation (4G), the fifth generation (5G), Long Term Evolution (LTE)—Frequency Division Duplex (FDD), LTE—Time Division Duplex (TDD), LTE-Advanced, and LTE-Advanced Pro. The frequency of the input signal RFin is about several hundreds of megahertz to several dozens of gigahertz. The communication standard and the frequency of the input signal RFin are not limited to the above-described examples.

The power amplifier module 10 includes amplifiers 20 and 30, bias circuits 40 and 50, an adjusting circuit 60, and matching circuits 70, 80, and 90.

The amplifier 20 (first amplifier) and the amplifier 30 (second amplifier), each amplify an input RF signal and outputs the amplified RF signal. The amplifier 20 is a first-stage (driver-stage) amplifier. Upon receiving a power supply voltage Vcc1 from a power supply terminal T1, the amplifier 20 amplifies the input signal RFin (first signal) received from an input terminal via the matching circuit 70, and outputs an RF signal RF1. The amplifier 30 is a second-stage (power-stage) amplifier. Upon receiving a power supply voltage Vcc2 from a power supply terminal T2, the amplifier 30 amplifies the RF signal RF1 (second signal) received from the amplifier 20 via the matching circuit 80 and outputs an RF signal RF2. The RF signal RF2 is output as an amplified signal RFout via the matching circuit 90. The amplifiers 20 and 30 are each constituted by a transistor, such as a heterojunction bipolar transistor (HBT). The amplifiers 20 and 30 may alternatively be each constituted by a field-effect transistor (FET), such as a metal-oxide-semiconductor field-effect transistor (MOS-FET). In this case, the collector, base, and emitter of a bipolar transistor may be read as the drain, gate, and source of an FET. In the following description, a transistor is an HBT unless otherwise stated.

Upon receiving a bias drive signal from a control terminal T3, the bias circuits 40 and 50 supply a bias current or a bias voltage to the amplifiers 20 and 30, respectively.

The adjusting circuit 60 adjusts the amount of bias current supplied from the bias circuit 40 to the first-stage amplifier 20. The detailed configurations of the amplifier 20, the bias circuit 40, and the adjusting circuit 60 will be discussed later.

The matching circuit (also called a matching network (MN)) 70 performs impedance matching between a circuit (not shown) preceding the power amplifier module 10 and the amplifier 20. The matching circuit 80 performs impedance matching between the amplifiers 20 and 30. The matching circuit 90 performs impedance matching between the amplifier 30 and a circuit (not shown) following the power amplifier module 10. The matching circuits 70, 80, and 90 are each constituted by an inductor and a capacitor, for example.

Although the power amplifier module 10 includes two stages of amplifiers 20 and 30 in this specification, it may include three or more stages of amplifiers.

Figure 2:
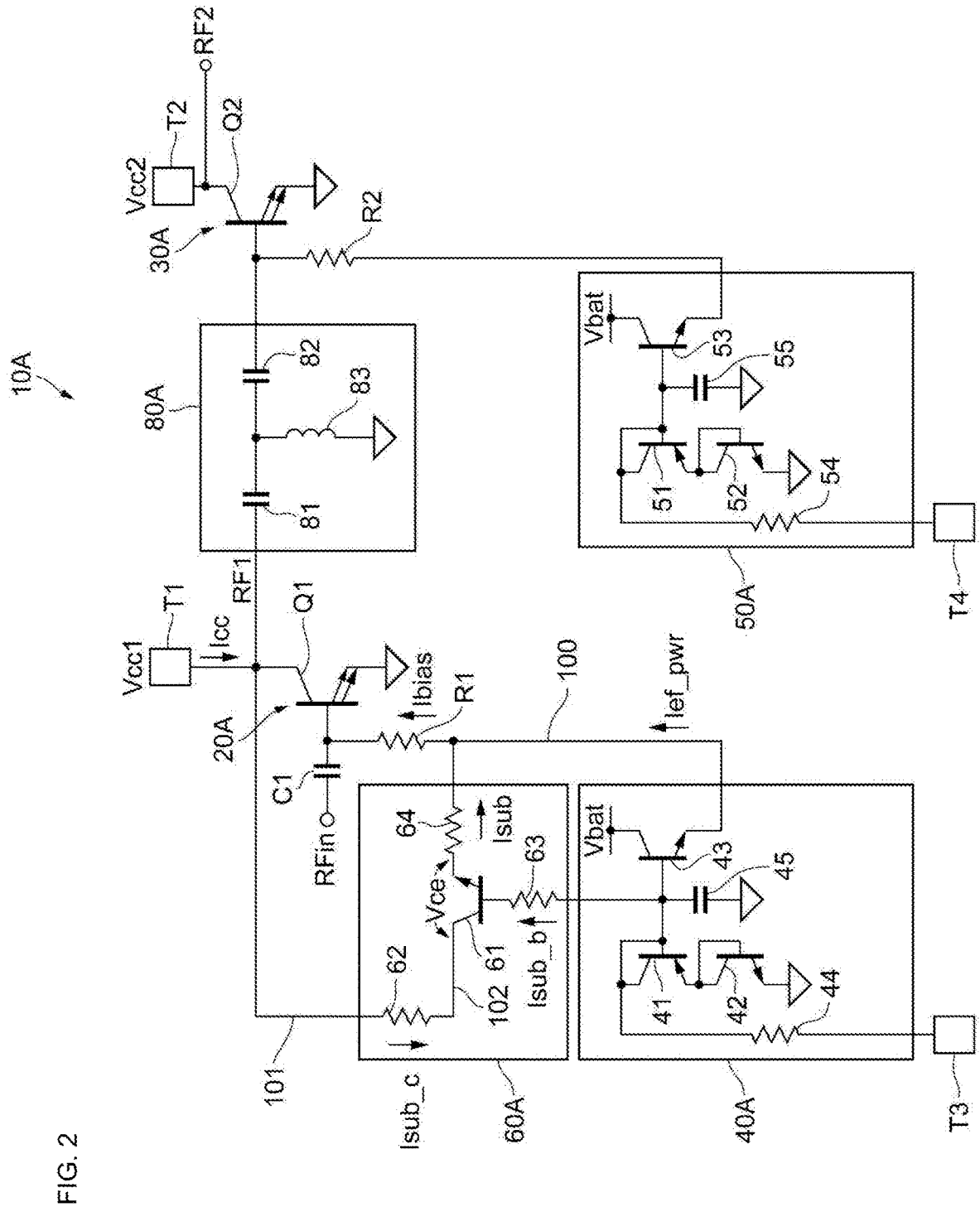
FIG. 2 is a circuit diagram illustrating an example of the configuration of the power amplifier module according to the first embodiment.

FIG. 2 illustrates an example of the configuration of a power amplifier module 10A according to the first embodiment. FIG. 2 illustrates the detailed configurations of the amplifiers 20 and 30, the bias circuits 40 and 50, the adjusting circuit 60, and the matching circuit 80 of the power amplifier module 10 shown in FIG. 1. The other elements of the power amplifier module 10 are not shown in FIG. 2.

Amplifiers 20A and 30A include transistors Q1 and Q2, respectively. The power supply voltage Vcc1 is supplied from the power supply terminal T1 to the collector of the transistor Q1. The input signal RFin is supplied to the base of the transistor Q1 via a capacitor C1. The emitter of the transistor Q1 is grounded. The amplifier 20A amplifies the input signal RFin and outputs the resulting RF signal RF1 from the collector of the transistor Q1. The power supply voltage Vcc2 is supplied from the power supply terminal T2 to the collector of the transistor Q2. The RF signal RF1 is supplied to the base of the transistor Q2 via the matching circuit 80. The emitter of the transistor Q2 is grounded. The amplifier 30A amplifies the RF signal RF1 and outputs the resulting RF signal RF2 from the collector of the transistor Q2. Each of the transistors Q1 and Q2 may be constituted by plural unit transistors connected in parallel with each other, and the plural unit transistors operate similarly to serve as one transistor. One unit transistor is a minimum configuration that contributes to serving as a transistor.

The input signal RFin is supplied to one end of the capacitor C1, and the other end of the capacitor C1 is connected to the base of the transistor Q1. The capacitor C1 allows AC components of an RF signal to pass therethrough and blocks DC components.

A bias circuit 40A (first bias circuit) supplies a bias current or a bias voltage, which controls a bias point of the transistor Q1, to the base of the transistor Q1 via a resistor element R1. The operation of the bias circuit 40A is controlled based on a bias drive signal supplied from the control terminal T3. The bias circuit 40A includes transistors 41 through 43, a resistor element 44, and a capacitor 45.

The transistors 41 and 42 are diode-connected transistors. In a diode-connected bipolar transistor, the base and the collector are connected to each other. The diode-connected bipolar transistor behaves like a two-terminal rectifying element (bipolar element) equivalent to a diode. That is, between the two terminals of a diode-connected bipolar transistor, the terminal having a higher potential when the diode-connected bipolar transistor is forward-biased serves as an anode, while the other terminal having a lower potential serves as a cathode. In the bias circuit 40A, the transistors 41 and 42 are connected in series with each other. A bias drive signal is supplied from the control terminal T3 to the collector of the transistor 41 via the resistor element 44. The collector of the transistor 42 is connected to the emitter of the transistor 41. The emitter of the transistor 42 is grounded. With this configuration, a predetermined voltage (about 2.8 V, for example) is generated at the collector of the transistor 41. Instead of the diode-connected transistors 41 and 42, p-n junction diodes may be used.

In the transistor 43, a voltage Vbat is supplied to the collector, and the base is connected to the collector of the transistor 41 and is also grounded via the capacitor 45. The emitter of the transistor 43 is connected to the base of the transistor Q1 via the resistor element R1, thereby supplying a bias current to the base of the transistor Q1.

A bias circuit 50A supplies a bias current or a bias voltage, which controls a bias point of the transistor Q2, to the base of the transistor Q2 via a resistor element R2. The operation of the bias circuit 50A is controlled based on a bias drive signal supplied from a control terminal T4. The bias circuit 50A includes transistors 51 through 53, a resistor element 54, and a capacitor 55. The configuration of the bias circuit 50A is similar to that of the bias circuit 40A, and a detailed explanation thereof will thus be omitted.

The control terminals T3 and T4 may be each connected to a voltage source, and a control voltage may be supplied as a bias drive signal. Alternatively, the control terminals T3 and T4 may be each connected to a current source, and a control current may be supplied as a bias drive signal.

An adjusting circuit 60A is a circuit for adjusting a bias current to be supplied to the base of the transistor Q1. The adjusting circuit 60A includes a transistor 61 and resistor elements 62 through 64.

A first voltage corresponding to the power supply voltage Vcc1 is supplied from the power supply terminal T1 to the collector (first terminal) of the transistor 61 (adjusting transistor) via the resistor element 62 (first resistor element). A second voltage corresponding to the bias drive signal is supplied from the control terminal T3 to the base (second terminal) of the transistor 61 via the resistor element 44 and the resistor element 63 (second resistor element). In the first embodiment, the base of the transistor 61 is connected to the base of the transistor 43. The emitter (third terminal) of the transistor 61 is connected to the base of the transistor Q1 via the resistor element 64 (third resistor element) and the resistor element R1. The emitter of the transistor 61 is also connected to the emitter of the transistor 43 via the resistor element 64. In the first embodiment, the transistor 61 is an HBT in which the emitter and the base form a heterojunction. The bandgap of the emitter is larger than that of the base.

The resistor element R1 is disposed between the bias circuit 40A and the base of the transistor Q1, while the resistor element R2 is disposed between the bias circuit 50A and the base of the transistor Q2.

A matching circuit 80A includes capacitors 81 and 82 and an inductor 83. The capacitors 81 and 82 are connected in series with each other. One end of the inductor 83 is connected to a node between the capacitors 81 and 82 and the other end is grounded. That is, the matching circuit 80 is constituted by a T-type CLC circuit. The configuration of the matching circuit 80 is not restricted to this type of circuit.

The operation of the power amplifier module 10A will now be discussed below with reference to FIGS. 3 through 8. Currents and voltages are represented in the following manner, as shown in FIG. 2. The currents flowing through the resistor elements 62 through 64 are Isub_c, Isub_b, and Isub, respectively. The current output from the emitter of the transistor 43 is Ief_pwr. The bias current supplied to the base of the transistor Q1 is Ibias. The current flowing through the collector of the transistor Q1 is Icc. The collector-emitter voltage of the transistor 61 is Vce. The bias current Ibias is expressed by Ibias=Ief_pwr+Isub. Accordingly, the current Ief_pwr and the current Isub partially contribute to adjusting the bias point of the transistor Q1. In this specification, each of the current Ief_pwr and the current Isub may be called a bias current. The current Isub is equal to the total current of Isub_b and Isub_c, that is, Isub=Isub_b+Isub_c.

Figure 3:
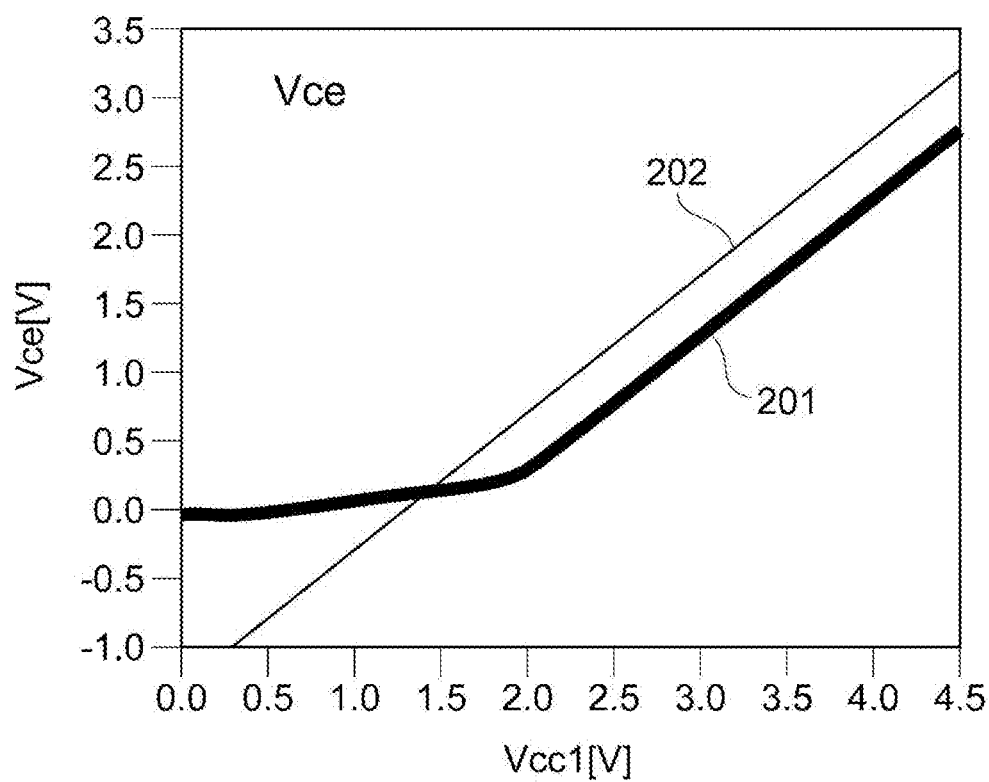
FIG. 3 is a graph illustrating the relationship between the collector-emitter voltage Vce of a transistor and the power supply voltage Vcc1.

FIG. 3 is a graph illustrating the relationship between the collector-emitter voltage Vce of the transistor 61 and the power supply voltage Vcc1. A slope 201 represents the collector-emitter voltage Vce of the transistor 61 in the power amplifier module 10A according to the first embodiment, while a slope 202 represents a collector-emitter voltage, which is the counterpart of the collector-emitter voltage Vce, of a transistor, which is the counterpart of the transistor 61, in a power amplifier module according to a comparative example. The power amplifier module of the comparative example is different from the power amplifier module 10A in that it does not include the adjusting circuit 60. In FIG. 3, the horizontal axis indicates the power supply voltage Vcc1, while the vertical axis indicates the voltage Vce.

Figure 4:
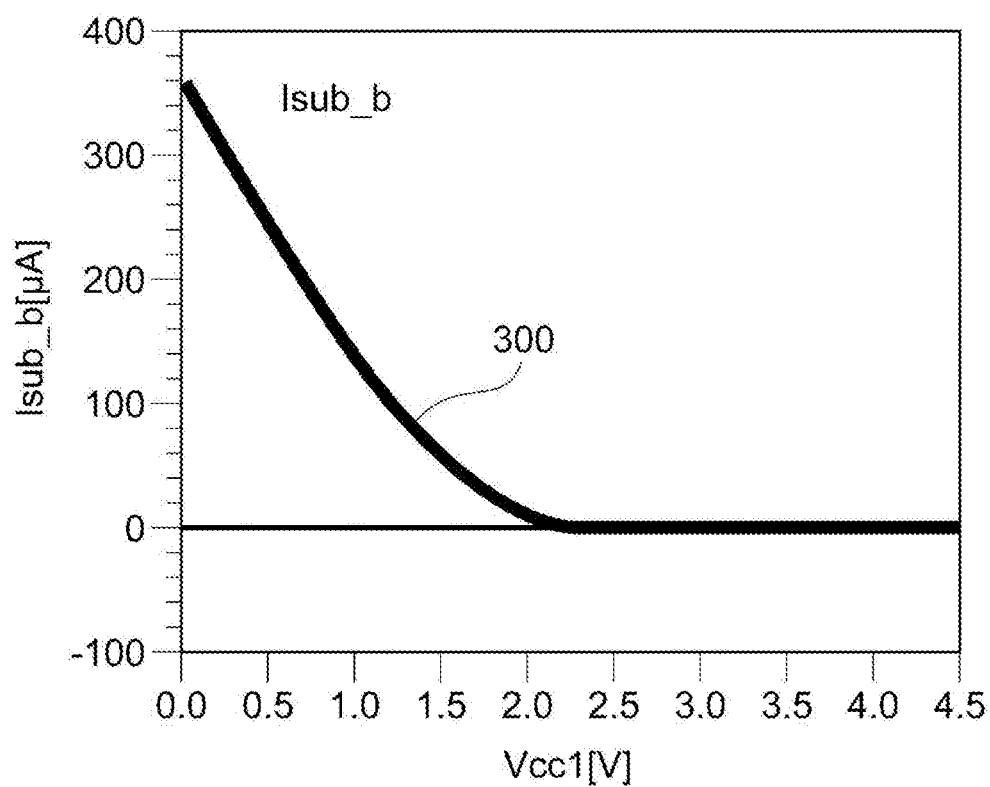
FIG. 4 is a graph illustrating the relationship between the current Isub_b and the power supply voltage Vcc1.

FIG. 4 is a graph illustrating the relationship between the current Isub_b and the power supply voltage Vcc1. A slope 300 represents the current Isub_b. In FIG. 4, the horizontal axis indicates the power supply voltage Vcc1, while the vertical axis indicates the current Isub_b.

Figure 5:
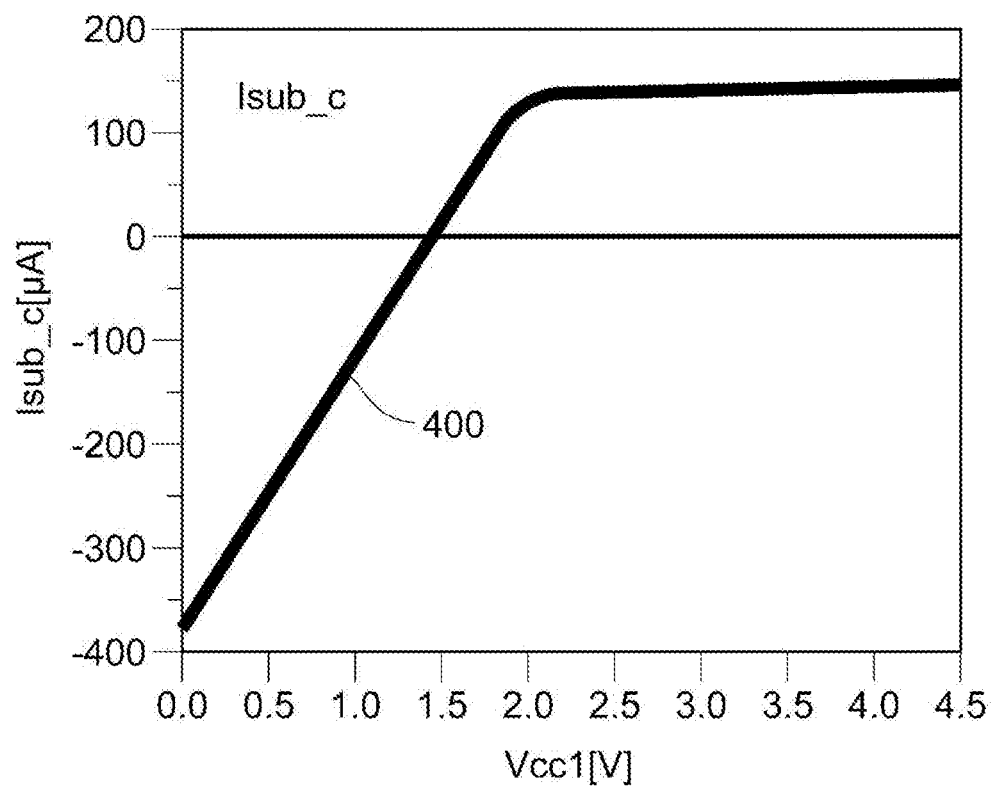
FIG. 5 is a graph illustrating the relationship between the current Isub_c and the power supply voltage Vcc1.

FIG. 5 is a graph illustrating the relationship between the current Isub_c and the power supply voltage Vcc1. A slope 400 represents the current Isub_c. In FIG. 5, the horizontal axis indicates the power supply voltage Vcc1, while the vertical axis indicates the current Isub_c.

Figure 6:
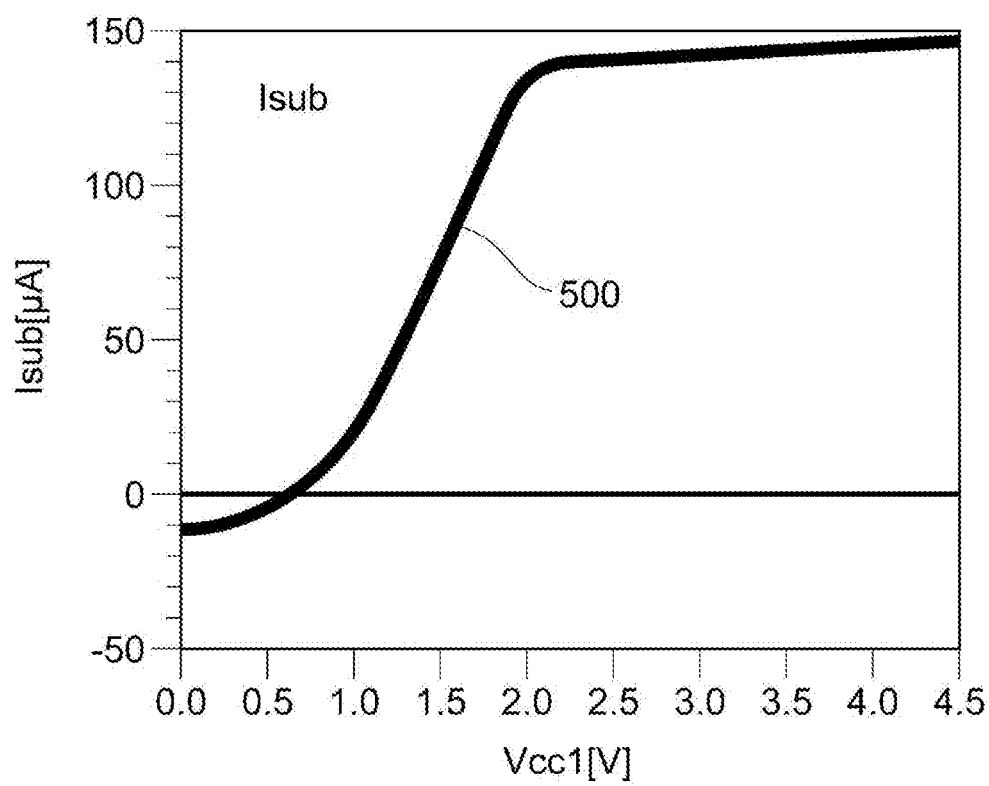
FIG. 6 is a graph illustrating the relationship between the current Isub and the power supply voltage Vcc1.

FIG. 6 is a graph illustrating the relationship between the current Isub and the power supply voltage Vcc1. A slope 500 represents the current Isub. In FIG. 6, the horizontal axis indicates the power supply voltage Vcc1, while the vertical axis indicates the current Isub.

Figure 7:
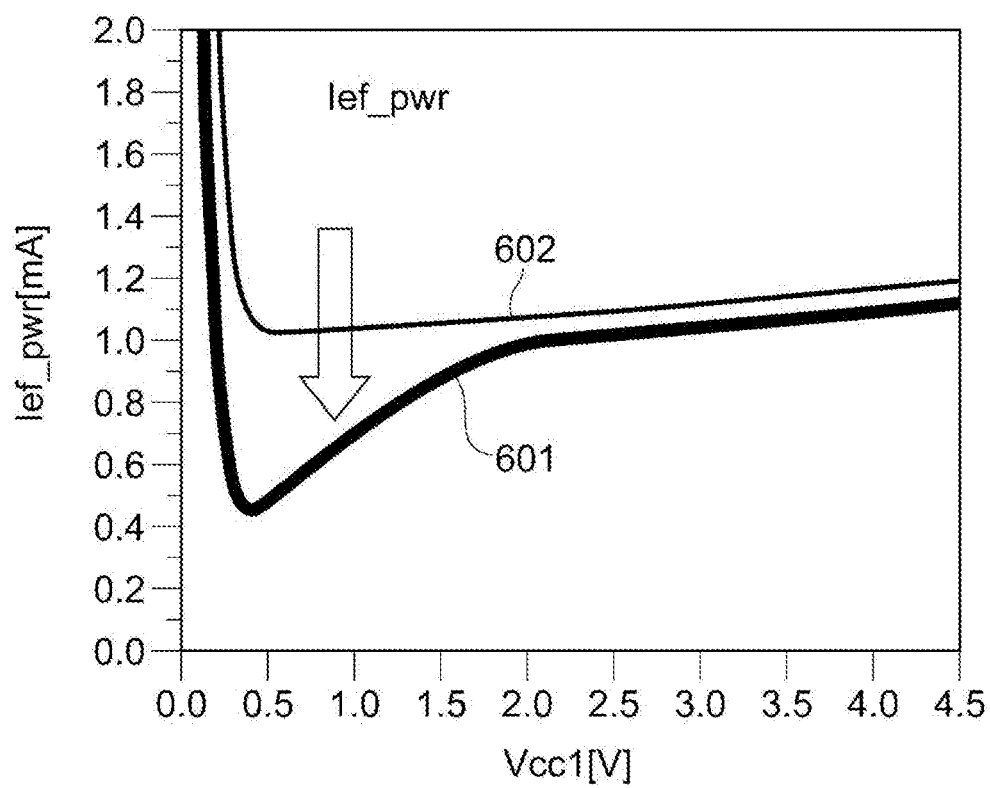
FIG. 7 is a graph illustrating the relationship between the current Ief_pwr and the power supply voltage Vcc1.

FIG. 7 is a graph illustrating the relationship between the current Ief_pwr and the power supply voltage Vcc1. A slope 601 represents the current Ief_pwr in the power amplifier module 10A according to the first embodiment, while a slope 602 represents a current, which is the counterpart of the current Ief_pwr, in the power amplifier module according to the comparative example. In FIG. 7, the horizontal axis indicates the power supply voltage Vcc1, while the vertical axis indicates the current Ief_pwr.

Figure 8:
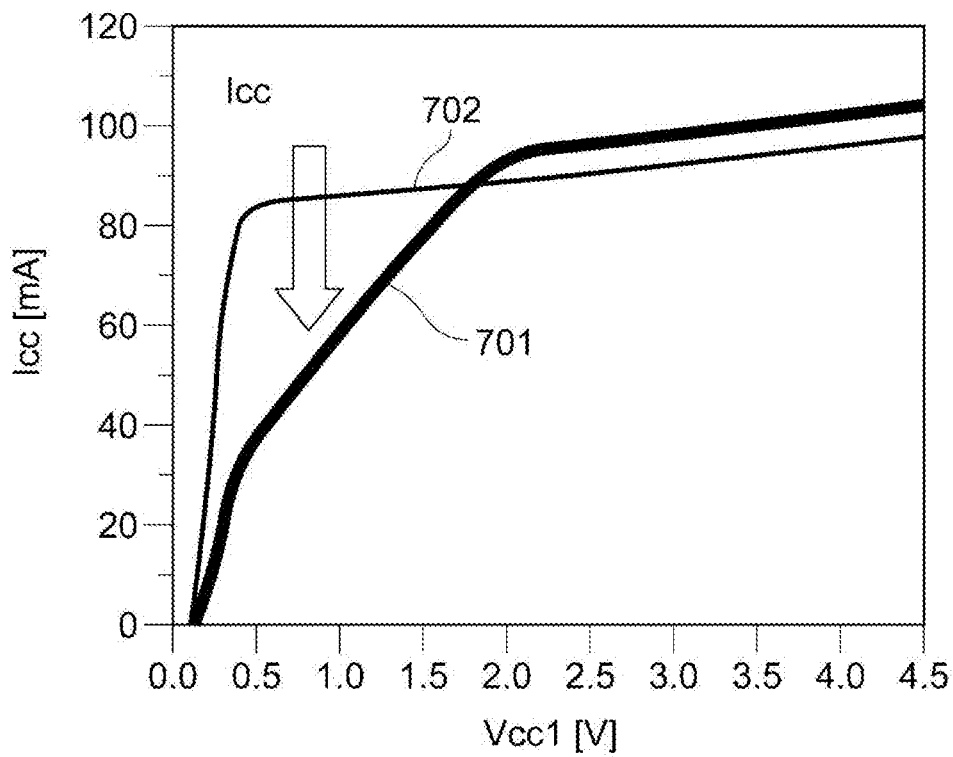
FIG. 8 is a graph illustrating the relationship between the current Icc and the power supply voltage Vcc1.

FIG. 8 is a graph illustrating the relationship between the current Icc and the power supply voltage Vcc1. A slope 701 represents the current Icc in the power amplifier module 10A according to the first embodiment, while a slope 702 represents a current, which is the counterpart of the current Icc, in the power amplifier module according to the comparative example. In FIG. 8, the horizontal axis indicates the power supply voltage Vcc1, while the vertical axis indicates the current Icc.

It is assumed that the power supply voltage Vcc1 varies in a range between the lowest voltage and the highest voltage. The lowest voltage is about 1.0 V, while the highest voltage is about 4.5 to 5.5 V.

The path through which a current flows from the bias circuit 40A to the base of the transistor Q1 via the resistor element R1 is set to be a first current path 100. The emitter of the transistor 43 is connected to the base of the transistor Q1 via the first current path 100. The emitter of the transistor 61 is connected to the first current path 100 via the resistor element 64. The path through which a current flows from the control terminal T3 to the power supply terminal T1 via the resistor elements 44 and 63, the base-collector of the transistor 61, and the resistor element 62 is set to be a second current path 101. The base of the transistor 43 is connected to the second current path 101. The path through which a current flows from the power supply terminal T1 to the base of the transistor Q1 via the resistor element 62, the collector-emitter of the transistor 61, the resistor element 64, and the resistor element R1 is set to be a third current path 102.

The transistor 61 is an HBT, and the ON-state voltage (about 1.1 V) of the base-collector p-n junction is different from that (about 1.3 V) of the base-emitter p-n junction. As shown in FIG. 3, the transistor 61 starts to behave differently with respect to a certain intermediate voltage (about 1.5 V, for example) of the power supply voltage Vcc1 as a turning point. The intermediate voltage is a voltage higher than the lowest voltage and lower than the highest voltage of the power supply voltage Vcc1. More specifically, when the power supply voltage Vcc1 is higher than the intermediate voltage, the transistor 61 operates as an emitter-follower circuit. When the power supply voltage Vcc1 is lower than or equal to the intermediate voltage, the transistor 61 operates as two p-n junction diodes.

When the transistor 61 operates as an emitter-follower circuit, the current Ief_pwr flows from the bias circuit 40A to the base of the transistor Q1 via the first current path 100, and also, the current Isub flows from the power supply terminal T1 to the base of the transistor Q1 via the third current path 102. In this case, the current Isub_b is only negligible (see FIG. 4), and the current Isub is thus almost equal to the current Isub_c (see FIGS. 5 and 6).

In contrast, when the transistor 61 operates as two p-n junction diodes, a current flows from the bias circuit 40A to the power supply terminal T1 via the second current path 101. The reason for this is as follows. The ON-state voltage of the base-collector p-n junction of the transistor 61 is lower than that of the base-emitter p-n junction, and a current is thus more likely to flow between the base and the collector of the transistor 61 than between the base and the emitter. In this case, the current Isub_c flows in the direction opposite that shown in FIG. 2. As the power supply voltage Vcc1 is lower, the adjusting circuit 60 increases the current Isub_c flowing from the bias circuit 40A to the power supply terminal T1 via the second current path 101 (see FIG. 5). As the current Isub_c flowing from the bias circuit 40A to the power supply terminal T1 via the second current path 101 increases, the bias current Ief_pwr flowing from the bias circuit 40A to the base of the transistor Q1 via the first current path 100 decreases.

As indicated by the slope 601 in FIG. 7, because of the operation of the adjusting circuit 60, when the power supply voltage Vcc1 is lower than or equal to the intermediate voltage, the bias current Ief_pwr is decreased, and when the power supply voltage Vcc1 is close to the highest voltage, the bias current Ief_pwr in the power amplifier module 10A approaches that in the comparative example. Due to a decrease in the bias current Ief_pwr, the current Icc flowing through the collector of the transistor Q1 is also reduced (see FIG. 8). It is thus possible to reduce the current Icc flowing through the transistor Q1 when the power supply voltage Vcc1 is in a range between the lowest voltage and the intermediate voltage.

As discussed above, in the power amplifier module 10A according to the first embodiment, when the transistor 61 operates as two p-n junction diodes, the bias current Ief_pwr flowing through the base of the transistor Q1 can be reduced. This can reduce the current flowing through the transistor Q1 and decrease the gain of the transistor Q1. In particular, using an HBT as the transistor 61 enables the transistor 61 to operate as two p-n junction diodes when the power supply voltage Vcc1 is in a range between the lowest voltage and the intermediate voltage. It is thus possible to reduce the current consumed in the transistor Q1 when the power supply voltage Vcc1 is relatively low compared with that when the power supply voltage Vcc1 is relatively high.

The power level of a signal output from the second-stage transistor Q2 is higher than that from the first-stage transistor Q1. The power supply voltage Vcc2 supplied to the second-stage transistor Q2 is thus more likely to be vulnerable to noise in an amplified signal than the power supply voltage Vcc1 supplied to the first-stage transistor Q1. In the first embodiment, the power supply voltage Vcc1 is supplied to the transistor 61 of the adjusting circuit 60. This makes it possible to reduce the influence of noise in an amplified signal compared with when the power supply voltage Vcc2 is supplied to the transistor 61. It is not however to intend to exclude the configuration in which the power supply voltage Vcc2 is supplied to the transistor 61.

In the first embodiment, the bias current to be supplied from the first-stage bias circuit 40 to the transistor Q1 is adjusted in the adjusting circuit 60. In addition to or instead of this configuration, the bias current to be supplied from the second-stage bias circuit 50 to the transistor Q2 may be adjusted.

Figure 9A:
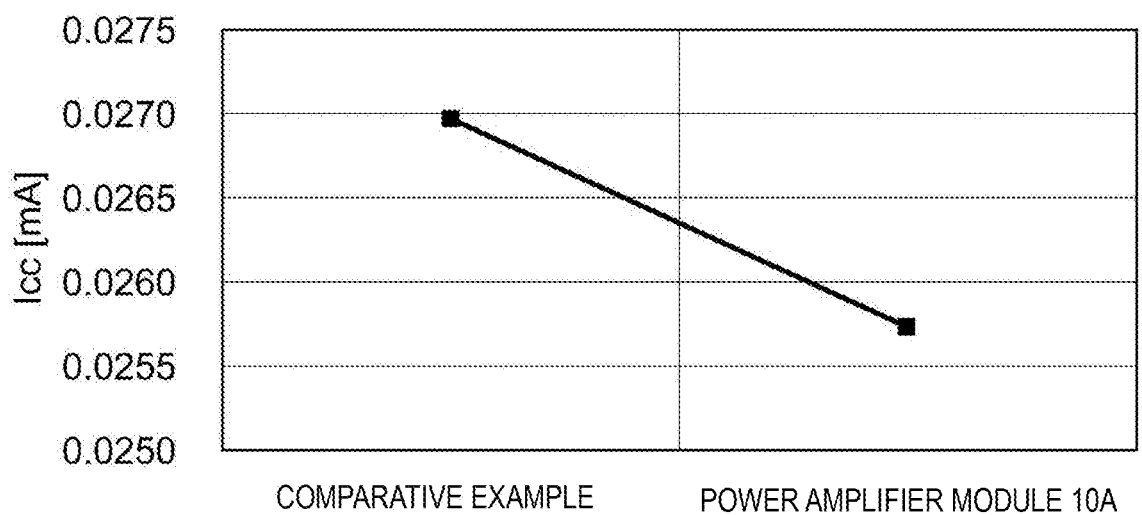
FIG. 9A is a graph illustrating a result of comparing the current Icc in the power amplifier module of the first embodiment and that in a comparative example.
Figure 9B:
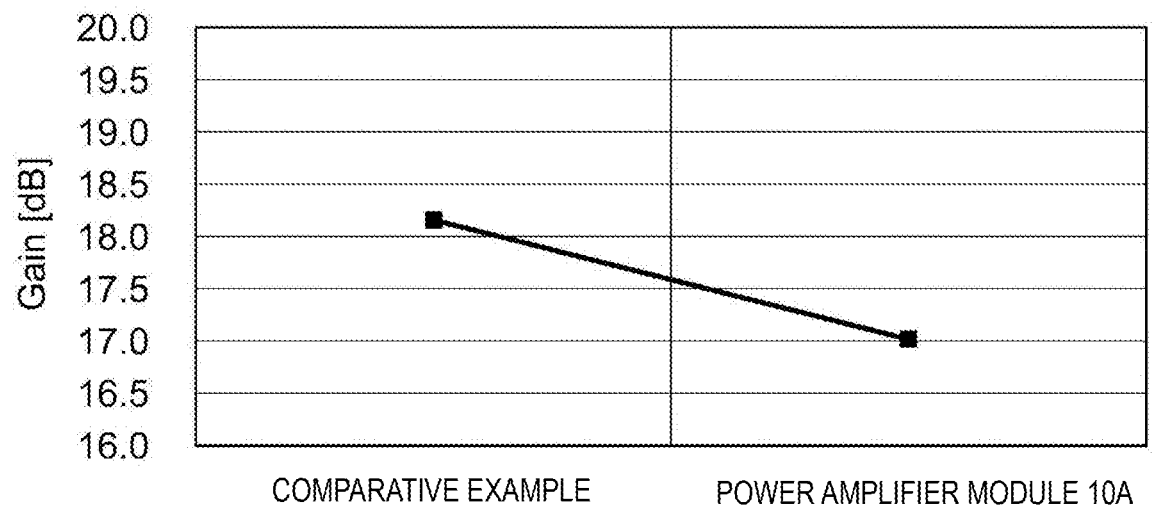
FIG. 9B is a graph illustrating a result of comparing the gain in the power amplifier module of the first embodiment and that in the comparative example.

FIG. 9A is a graph illustrating a result of comparing the current Icc in the power amplifier module 10A of the first embodiment and that in the comparative example. FIG. 9B is a graph illustrating a result of comparing the gain in the power amplifier module 10A of the first embodiment and that in the comparative example. The results illustrated in the graphs in FIGS. 9A and 9B are simulation results when output power of the first-stage amplifier is 4 dBm and the power supply voltage Vcc1 is 1.0 V both in the first embodiment and the comparative example.

FIG. 9A shows that the current Icc flowing through the transistor Q1 in the power amplifier module 10A of the first embodiment is reduced to be smaller than that in the comparative example. FIG. 9B shows that the gain in the power amplifier module 10A is decreased to be smaller than that in the comparative example. The reason for obtaining these results is that the power amplifier module 10A includes the adjusting circuit 60.

Figure 10:
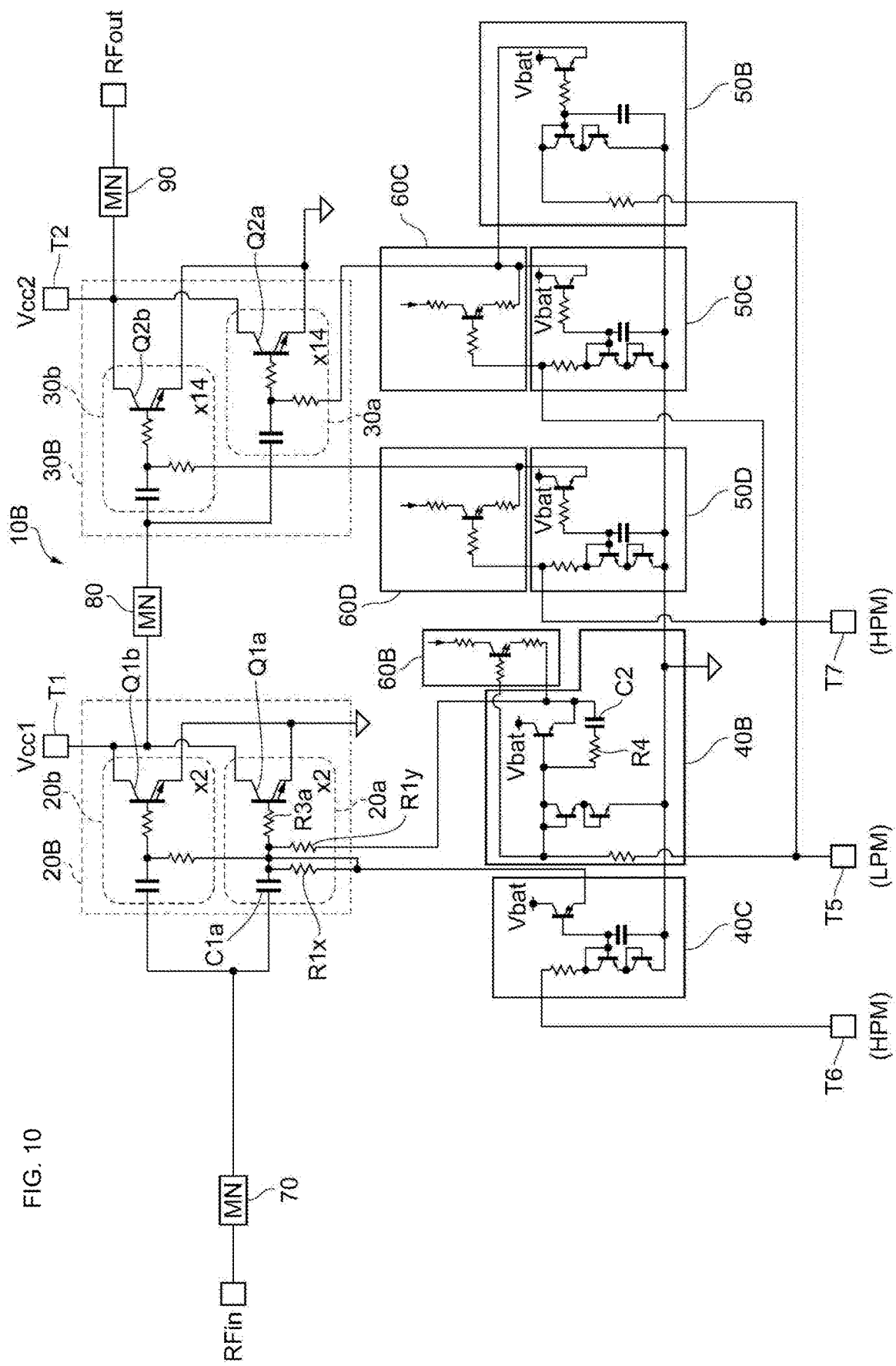
FIG. 10 is a circuit diagram illustrating an example of the configuration of a power amplifier module according to a second embodiment of the disclosure.

FIG. 10 illustrates an example of the configuration of a power amplifier module 10B according to a second embodiment. In the second embodiment, elements identical or similar to those of the first embodiment are designated by like reference numerals, and an explanation thereof will be omitted. The second embodiment will be described mainly by referring to points different from the first embodiment while omitting the same points as those of the first embodiment. An explanation of similar advantages obtained by similar configurations will not be repeated.

The power amplifier module 10B of the second embodiment is different from the power amplifier module 10A of the first embodiment in that it operates in different operation modes according to the power level of an output signal. More specifically, the operation mode includes a low power mode (first mode) and a high power mode (second mode). In the high power mode, the power level of an output signal is higher than that in the low power mode. The detailed configuration of the power amplifier module 10B will be discussed below.

The power amplifier module 10B includes amplifiers 20B and 30B, bias circuits 40B, 40C, 50B, 50C, and 50D, adjusting circuits 60B through 60D, and matching circuits 70, 80, and 90.

The first-stage amplifier 20B includes two first cells 20a and two second cells 20b. Each of the first cells 20a includes a first unit transistor Q1a corresponding to the transistor Q1, resistor elements R1x and R1y corresponding to the resistor element R1, a capacitor C1a corresponding to the capacitor C1, and a resistor element R3a connected in series with the base of the first unit transistor Q1a. The configuration of the second cells 20b is similar to that of the first cells 20a, and an explanation thereof will be omitted. The first and second cells 20a and 20b are connected in parallel with each other and operate similarly so as to function as one amplifier. In the second embodiment, two first cells 20a and two second cells 20b are provided. However, the number of first cells 20a and that of the second cells 20b are not limited to two.

The second-stage amplifier 30B includes fourteen third cells 30a and fourteen fourth cells 30b. The configurations of the third and fourth cells 30a and 30b are similar to the configuration of the first cells 20a, and an explanation thereof will be omitted. In the second embodiment, fourteen third cells 30a and fourteen fourth cells 30b are provided. However, the number of third cells 30a and that of the fourth cells 30b are not limited to fourteen.

The ON/OFF state of the unit transistor included in each cell is switched in accordance with a bias current supplied to the unit transistor. The bias circuit 40B (first bias circuit) supplies a bias current to the first unit transistors Q1a included in the first cells 20a. The bias circuit 40C (second bias circuit) supplies a bias current to the first unit transistors Q1a included in the first cells 20a and the second unit transistors Q1b included in the second cells 20b. The bias circuit 50B (third bias circuit) and the bias circuit 50C (fourth bias circuit), each supply a bias current to the third unit transistors Q2a included in the third cells 30a. The bias circuit 50D (fifth bias circuit) supplies a bias current to fourth unit transistors Q2b included in the fourth cells 30b. The configurations of the bias circuits 40C and 50B through 50D are similar to the configuration of the bias circuit 40A shown in FIG. 2, and an explanation thereof will be omitted. The bias circuit 40B is different from the bias circuit 40A in that it includes a resistor element R4 and a capacitor C2. The resistor element R4 and the capacitor C2 are connected in series with each other so as to connect the base and the emitter of a transistor, which is the counterpart of the transistor 43 of the bias circuit 40A. This applies negative feedback to the transistor, thereby making it possible to stably supply a bias current.

The adjusting circuits 60B through 60D respectively adjust bias currents output from the bias circuits 40B, 50C, and 50D. The configurations of the adjusting circuits 60B through 60D are similar to the configuration of the adjusting circuit 60A shown in FIG. 2, and an explanation thereof will be omitted. For the sake of convenience, the power supply voltage Vcc1 supplied to the resistor elements of the adjusting circuits 60B through 60D are indicated by the arrows in FIG. 10.

When the power amplifier module 10B operates in accordance with the low power mode, a bias drive signal supplied from a control terminal T5 drives the bias circuits 40B and 50B. This switches ON the two first unit transistors Q1a in the first-stage amplifier 20B and also switches ON the fourteen third unit transistors Q2a in the second-stage amplifier 30B. In this case, the two second unit transistors Q1b and the fourteen fourth unit transistors Q2b are OFF.

When the power amplifier module 10B operates in accordance with the high power mode, a bias drive signal supplied from a control terminal T6 drives the bias circuit 40C, while a bias drive signal supplied from a control terminal T7 drives the bias circuits 50C and 50D. This switches ON both the two first unit transistors Q1a and the two second unit transistors Q1b in the first-stage amplifier 20B and also switches ON both the fourteen third unit transistors Q2a and the fourteen fourth unit transistors Q2b in the second-stage amplifier 30B.

In this manner, as a result of changing the total number of operating unit transistors in accordance with the power mode, power is amplified suitably for the selected power mode.

Additionally, in the second embodiment, in the case of the low power mode, the bias current adjusted by the adjusting circuit 60B is supplied to the first unit transistors Q1a (that is, part of the first-stage modulator 20B). It is thus possible to reduce the current flowing through the first unit transistors Q1a and to decrease the gain when the power supply voltage Vcc1 is relatively low, as in the power amplifier module 10A of the first embodiment. In the case of the high power mode, the bias circuit 40C is driven instead of the bias circuit 40B, thereby avoiding the influence of the adjusting circuit 60B.

The adjusting circuits 60C and 60D respectively connected to the bias circuits 50C and 50D are provided for the following purpose. When the power amplifier module 10B operates in the envelope tracking mode in which the power supply voltage Vcc1 varies in response to the envelope of the input signal RFin, the adjusting circuits 60C and 60D serve to increase the difference in the gain in response to the variation in the power supply voltage Vcc1.

The embodiments of the disclosure have been discussed above through illustration of examples. The power amplifier module 10 includes the amplifiers 20 and 30, the bias circuit 40, and the adjusting circuit 60. The amplifier 20 amplifies a first signal. The amplifier 30 amplifies a second signal based on an output signal from the amplifier 20. The bias circuit 40 supplies a bias current to the amplifier 20 via a current path on the basis of a bias drive signal. The adjusting circuit 60 includes the transistor 61 having first, second, and third terminals. A first voltage based on the power supply voltage Vcc1 is supplied to the first terminal. A second voltage based on the bias drive signal is supplied to the second terminal. The third terminal is connected to the current path. The adjusting circuit 60 adjusts the bias current on the basis of the power supply voltage Vcc1 supplied to the amplifier 20. The transistor 61 operates as two p-n junction diodes when the power supply voltage Vcc1 is relatively low. It is thus possible to decrease the bias current flowing through the base of the transistor Q1 of the amplifier 20 and thus to reduce the current consumed in the amplifier 20.

In the power amplifier module 10A, the adjusting circuit 60A further includes the resistor elements 62 through 64. The first voltage is supplied from the power supply terminal T1 to the first terminal of the transistor 61 via the resistor element 62. The second voltage is supplied to the second terminal of the transistor 61 via the resistor element 63. The third terminal of the transistor 61 is connected to the first current path 100 via the resistor element 64. As the power supply voltage Vcc1 is lower, the adjusting circuit 60A is able to increase the current Isub_c flowing from the bias circuit 40A to the power supply terminal T1 via the second current path 101 to be greater.

The power amplifier module 10B operates in accordance with an operation mode including a low power mode and a high power mode. The amplifier 20B includes a single or a plurality of first unit transistors Q1a and a single or a plurality of second unit transistors Q1b. The single or the plurality of first unit transistors Q1a are ON when the power amplifier module 10B operates in accordance with either of the low power mode and the high power mode. The single or the plurality of second unit transistors are OFF when the power amplifier module 10B operates in accordance with the low power mode and are ON when the power amplifier module 10B operates in accordance with the high power mode. The bias circuit 40B supplies a bias current to the single or the plurality of first unit transistors Q1a included in the amplifier 20B. This configuration makes it possible to reduce the current consumed in the operation in the low power mode while avoiding the influence on the amplifying operation in the high power mode.

In the power amplifier module 10B, the amplifier 30B includes a single or a plurality of third unit transistors Q2a and a single or a plurality of fourth unit transistors Q2b. The single or the plurality of third unit transistors Q2a are ON when the power amplifier module 10B operates in accordance with either of the low power mode and the high power mode. The single or the plurality of fourth unit transistors Q2b are OFF when the power amplifier module 10B operates in accordance with the low power mode and are ON when the power amplifier module 10B operates in accordance with the high power mode. The power amplifier module 10B further includes the bias circuits 40C, 50B, 50C, and 50D. The bias circuit 40C supplies a bias current to the single or the plurality of first unit transistors Q1a and the single or the plurality of second unit transistors Q1b. The bias circuits 50B and 50C, each supply a bias current to the single or the plurality of third unit transistors Q2a. The bias circuit 50D supplies a bias current to the single or the plurality of fourth unit transistors Q2b. When the power amplifier module 10B operates in accordance with the low power mode, the bias circuits 40B and 50B are driven. When the power amplifier module 10B operates in accordance with the high power mode, the bias circuits 40C, 50C, and 50D are driven. This configuration makes it possible to reduce the current consumed in the operation in the low power mode while avoiding the influence on the amplifying operation in the high power mode.

The above-described embodiments are provided for facilitating the understanding of the disclosure, but are not intended to be exhaustive or to limit the disclosure to the precise forms disclosed. Modifications and/or improvements may be made without necessarily departing from the spirit and scope of the disclosure, and equivalents of the disclosure are also encompassed in the disclosure. That is, suitable design changes made to the embodiments by those skilled in the art are also encompassed in the disclosure within the spirit and scope of the disclosure. For example, the elements and the positions thereof of the embodiments are not restricted to those described in the embodiments and may be changed in an appropriate manner.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier module comprising:
   a first amplifier supplied with a power supply voltage and configured to amplify a first signal;
   a second amplifier configured to amplify a second signal based on an output signal from the first amplifier;
   a first bias circuit configured to supply a bias current to the first amplifier based on a bias drive signal, the bias current being supplied via a current path; and
   an adjusting circuit comprising:
      an adjusting transistor having first, second, and third terminals, wherein a first voltage based on the power supply voltage is supplied to the first terminal, a second voltage based on the bias drive signal is supplied to the second terminal, and the third terminal is connected to the current path,
   wherein the adjusting circuit is configured to adjust the bias current based on the power supply voltage supplied to the first amplifier.

2. The power amplifier module according to claim 1, wherein:
   the adjusting circuit further comprises first, second, and third resistor elements,
   the first voltage is supplied from a power supply terminal to the first terminal of the adjusting transistor via the first resistor element,
   the second voltage is supplied to the second terminal of the adjusting transistor via the second resistor element, and
   the third terminal of the adjusting transistor is connected to the current path via the third resistor element.

3. The power amplifier module according to claim 1, wherein:
   the power amplifier module is configured to operate in a first operation mode or a second operation mode, a power level of an output signal of the power amplifier module being greater in the second operation mode than in the first operation mode,
   the first amplifier comprises:
      at least one first unit transistor that is ON when the power amplifier module operates in the first operation mode or the second operation mode; and
      at least one second unit transistor that is OFF when the power amplifier module operates in the first operation mode and that is ON when the power amplifier module operates in the second operation mode, and
   the first bias circuit is configured to supply the bias current to the at least one first unit transistor of the first amplifier.

4. The power amplifier module according to claim 2, wherein:
   the power amplifier module is configured to operate in a first operation mode or a second operation mode, a power level of an output signal of the power amplifier module being greater in the second operation mode than in the first operation mode,
   the first amplifier comprises:
      at least one first unit transistor that is ON when the power amplifier module operates in the first operation mode or the second operation mode; and
      at least one second unit transistor that is OFF when the power amplifier module operates in the first operation mode and that is ON when the power amplifier module operates in the second operation mode, and
   the first bias circuit is configured to supply the bias current to the at least one first unit transistor of the first amplifier.

5. The power amplifier module according to claim 3, wherein:
   the second amplifier comprises:
      at least one third unit transistor that is ON when the power amplifier module operates in the first operation mode or the second operation mode; and
      at least one fourth unit transistor that is OFF when the power amplifier module operates in the first operation mode and that is ON when the power amplifier module operates in the second operation mode,
   the power amplifier module further comprises:
      a second bias circuit configured to supply a second bias current to the at least one first unit transistor and the at least one second unit transistor;
      a third bias circuit configured to supply a third bias current to the at least one third unit transistor;
      a fourth bias circuit configured to supply a fourth bias current to the at least one third unit transistor; and
      a fifth bias circuit configured to supply a fifth bias current to the at least one fourth unit transistor,
   when the power amplifier module operates in the first operation mode, the first and third bias circuits are driven to supply the bias current and third bias current, respectively, and
   when the power amplifier module operates in the second operation mode, the second, fourth, and fifth bias circuits are driven to supply the second, fourth, and fifth bias currents, respectively.

6. The power amplifier module according to claim 4, wherein:
   the second amplifier comprises:
      at least one third unit transistor that is ON when the power amplifier module operates in the first operation mode or the second operation mode; and
      at least one fourth unit transistor that is OFF when the power amplifier module operates in the first operation mode and that is ON when the power amplifier module operates in the second operation mode,
   the power amplifier module further comprises:
      a second bias circuit configured to supply a second bias current to the at least one first unit transistor and the at least one second unit transistor;
      a third bias circuit configured to supply a third bias current to the at least one third unit transistor;
      a fourth bias circuit configured to supply a fourth bias current to the at least one third unit transistor; and a fifth bias circuit configured to supply a fifth bias current to the at least one fourth unit transistor, when the power amplifier module operates in the first operation mode, the first and third bias circuits are driven to supply the bias current and the third bias current, respectively, and when the power amplifier module operates in the second operation mode, the second, fourth, and fifth bias circuits are driven to supply the second, fourth, and fifth bias currents, respectively.

* * * * *